United States Patent
Camacho et al.

(10) Patent No.: US 8,129,827 B2
(45) Date of Patent: Mar. 6, 2012

(54) INTEGRATED CIRCUIT PACKAGE SYSTEM WITH PACKAGE ENCAPSULATION HAVING RECESS

(75) Inventors: Zigmund Ramirez Camacho, Singapore (SG); Jeffrey D. Punzalan, Singapore (SG); Jairus Legaspi Pisigan, Singapore (SG); Abelardo Jr Hadap Advincula, Singapore (SG)

(73) Assignee: Stats Chippac Ltd., Singapore (SG)

( * ) Notice: Subject to any disclaimer, the term of this patent is extended or adjusted under 35 U.S.C. 154(b) by 226 days.

(21) Appl. No.: 11/855,114

(22) Filed: Sep. 13, 2007

(65) Prior Publication Data

US 2009/0072412 A1     Mar. 19, 2009

(51) Int. Cl.
*H01L 23/02* (2006.01)

(52) U.S. Cl. ........ 257/678; 257/666; 257/690; 257/704; 257/787; 257/789; 257/E23.01

(58) Field of Classification Search ............. 257/666, 257/690, 704, 787, 789, E23.01, 678
See application file for complete search history.

(56) References Cited

U.S. PATENT DOCUMENTS 5,604,376 A    2/1997    Hamburgen et al.
(Continued)

*Primary Examiner* — Tan N Tran
(74) *Attorney, Agent, or Firm* — Mikio Ishimaru

(57) ABSTRACT

An integrated circuit package system includes: forming an external interconnect; connecting an integrated circuit die and the external interconnect; forming a package encapsulation, having a recess, covering the integrated circuit die with a portion of the external interconnect exposed by the recess; and connecting an integrated circuit device and the external interconnect in the recess.

20 Claims, 5 Drawing Sheets

U.S. PATENT DOCUMENTS

| | | |
|---|---|---|
| 6,261,870 B1 | 7/2001 | Haehn et al. |
| 6,504,238 B2 | 1/2003 | Cheng et al. |
| 6,841,859 B1 | 1/2005 | Thamby et al. |
| 6,882,021 B2 | 4/2005 | Boon et al. |
| 2004/0262773 A1* | 12/2004 | Joh et al. ............ 257/777 |
| 2005/0046003 A1* | 3/2005 | Tsai ............ 257/686 |

* cited by examiner

INTEGRATED CIRCUIT PACKAGE SYSTEM WITH PACKAGE ENCAPSULATION HAVING RECESS

TECHNICAL FIELD

The present invention relates generally to integrated circuit package system, and more particularly to integrated circuit package system with leads.

BACKGROUND ART

Increased miniaturization of components, greater packaging density of integrated circuits ("ICs"), higher performance, and lower cost are ongoing goals of the computer industry. As new generations of IC products are released, the number of devices used to fabricate them tends to decrease due to advances in technology. Simultaneously, the functionality of these products increases.

Semiconductor package structures continue to advance toward miniaturization and thinning to increase the density of the components that are packaged therein while decreasing the sizes of the products that are made therefrom. This is in response to continually increasing demands on information and communication apparatus for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook personal computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor die (or "chip") packages are of the type where a semiconductor die is molded into a package with a resin, such as an epoxy molding compound. The packages have a lead frame whose leads are projected from the package body, to provide a path for signal transfer between the die and external devices. Other conventional package configurations have contact terminals or pads formed directly on the surface of the package.

Such a conventional semiconductor package is fabricated through the following processes: a die-bonding process (mounting the semiconductor die onto the paddle of a lead frame), a wire-bonding process (electrically connecting the semiconductor die on the paddle to inner leads using lead frame wires), a molding process (encapsulating a predetermined portion of the assembly, containing the die, inner leads and lead frame wires, with an epoxy resin to form a package body), and a trimming process (completing each assembly as individual, independent packages).

The semiconductor packages, thus manufactured, are then mounted by matching and soldering the external leads or contact pads thereof to a matching pattern on a circuit board, to thereby enable power and signal input/output ("I/O") operations between the semiconductor devices in the packages and the circuit board.

An exemplary semiconductor package, well known in the electronics industry, is the quad flat package ("QFP"). QFP packages typically comprise a lead frame, such as a conductive sheet stamped and etched, with a semiconductor die having a multitude of bond pads mounted to the top side of the lead frame. Wire bonds electrically connect the bond pads, of the semiconductor die, to a series of conductive lead fingers on the topside of the lead frame. Typically, the semiconductor die and the wire bonds are encapsulated within a molding compound.

In order to reduce manufacturing costs, the electronics industry is increasing the usage of QFP packages. In the manufacturing process, many obstacles must be overcome to deliver extremely small packages with thinner and thinner profile in high volume. Despite the trend towards miniaturization and thinner profile, more functions and more integrated circuits continue to be packed into QFP packages.

Thus, a need still remains for an integrated circuit package system providing low cost manufacturing, improved yield, improved reliability, and increased integration. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: forming an external interconnect; connecting an integrated circuit die and the external interconnect; forming a package encapsulation, having a recess, covering the integrated circuit die with a portion of the external interconnect exposed by the recess; and connecting an integrated circuit device and the external interconnect in the recess.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
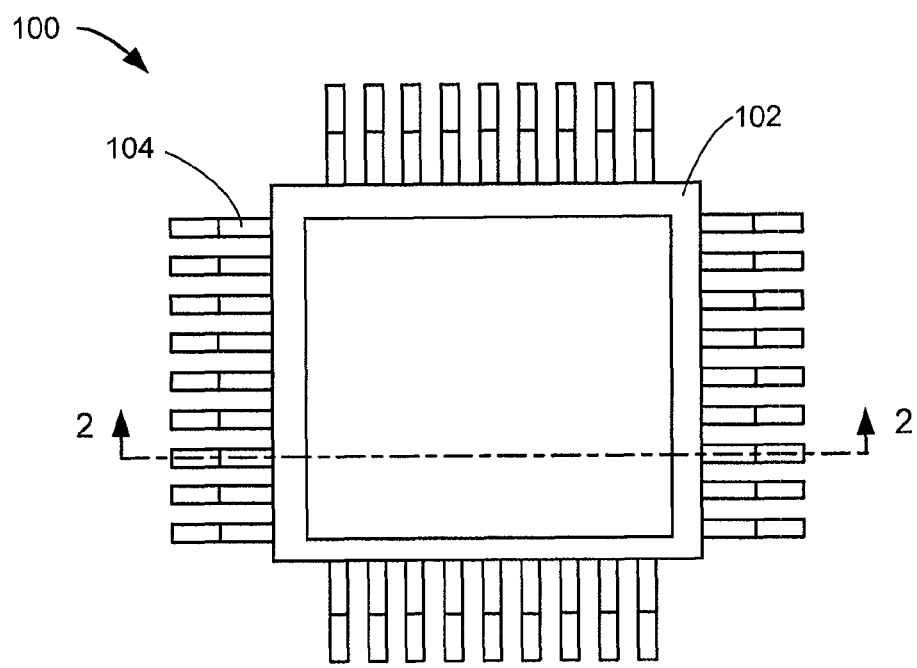
FIG. 1 is a top view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a top view of an integrated circuit package system 100 in a first embodiment of the present invention. The top view depicts a package encapsulation 102, such as an epoxy molded compound, with external interconnects 104 extending therefrom. The external interconnects 104 may be a number of types of leads. For example, the external interconnects 104 may be leads for a quad flat package.

For illustrative purposes, the external interconnects 104 are shown extending from the package encapsulation 102, although it is understood that the external interconnects 104 may not extend from the package encapsulation 102. For example, the external interconnects 104 may be within and exposed by the package encapsulation 102.

Figure 2:
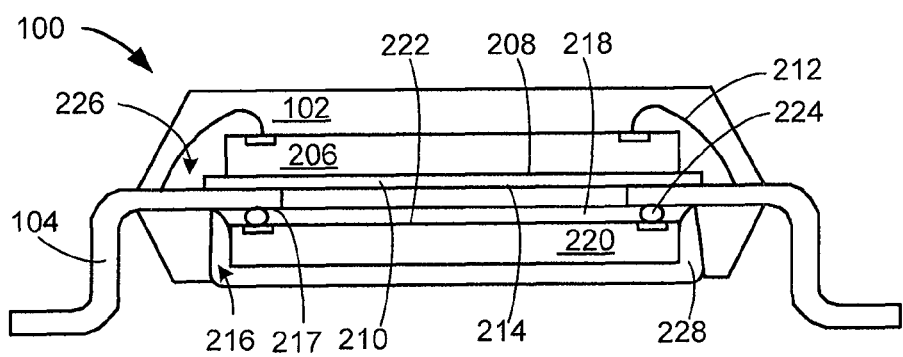
FIG. 2 is a cross-sectional view of the integrated circuit package system of FIG. 1 along a line 2-2.

Referring now to FIG. 2, therein is shown a cross-sectional view of the integrated circuit package system 100 of FIG. 1 along a line 2-2. The cross-sectional view depicts an integrated circuit die 206 mounted over a first mounting surface 208 of a mounting structure 210, such as a nonconductive adhesive. The integrated circuit die 206 is electrically connected to a predetermined selection of the external interconnects 104 with inner interconnects 212 such as bond wires or ribbon bonds.

The mounting structure 210 also includes a second mounting surface 214 on an opposing side of the first mounting surface 208, the second mounting surface 214 mounted to the external interconnects 104. The package encapsulation 102, such as an epoxy molding compound, encapsulates the integrated circuit die 206 mounted on the first mounting surface 208, the inner interconnects 212, and the mounting structure 210. The package encapsulation 102 includes a recess 216 partially exposing an interior portion 217 of the external interconnects 104, from the package encapsulation 102.

An adhesive 218, such as an under-fill, attaches an integrated circuit device 220, such as another integrated circuit die or a flip chip, with the package encapsulation 102 and the external interconnects 104 exposed in the recess 216. The integrated circuit device 220 is not covered by and does not contact the package encapsulation 102. A device active side 222 of the integrated circuit device 220 faces the second mounting surface 214. The integrated circuit device 220 is electrically connected on the device active side 222 with device interconnects 224, such as solder bumps. The device interconnects 224 connects the device active side 222 to a predetermined selection of the external interconnects 104 at a tip 226 of the external interconnects 104, at an opposing side of the external interconnect with the integrated circuit die 206. The external interconnects 104 are attached between the integrated circuit device 220 and the integrated circuit die 206.

Preferably, an inner encapsulation 228 is formed over the integrated circuit device 220. The inner encapsulation 228 is optional and may be made of the same material as the package encapsulation 102 or a different material. The inner encapsulation 228 encapsulates the integrated circuit device 220 and the device interconnects 224 in the recess 216. The inner encapsulation 228 also fills the recess 216 covering the interior portion of the external interconnects 104 exposed by the package encapsulation 102 in the recess 216 forming the integrated circuit package system 100 with the option of including the inner encapsulation 228.

Thicknesses of the package encapsulation 102 and the inner encapsulation 228 do not impede the external interconnects 104 for connections to the next system level, such as a printed circuit board or another integrated circuit package system, thereby increasing the integrated circuit content. Increased package density maximizes integration of integrated circuits and functionalities within an integrated circuit package.

Figure 3:
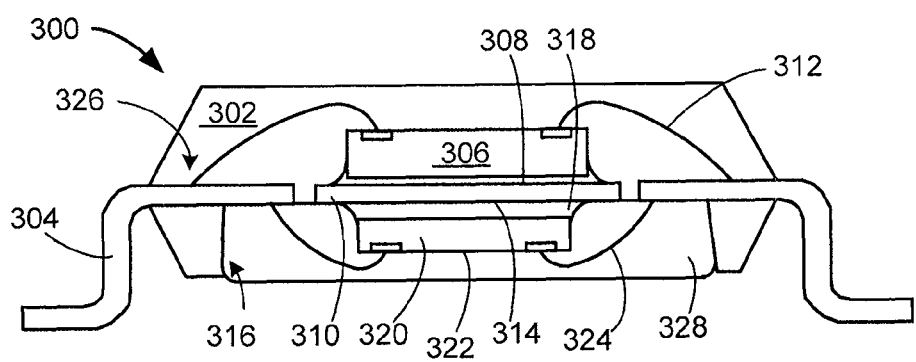
FIG. 3 is a cross-sectional view similar to FIG. 2 of an integrated circuit package system in a second embodiment of the present invention.

Referring now to FIG. 3, therein is shown a cross-sectional view similar to FIG. 2 of an integrated circuit package system 300 in a second embodiment of the present invention. The integrated circuit package system 300 includes structural similarities to the integrated circuit package system 100 of FIG. 2. However, the integrated circuit package system 300 include a die-attach paddle 310 as the mounting structure, wherein the die-attach paddle 310 may be formed with external interconnects 304, such as leads, from a lead frame (not shown).

The cross-sectional view depicts an integrated circuit die 306 mounted such as with an adhesive 318 over a first mounting surface 308 of the die-attach paddle 310. The integrated circuit die 306 is electrically connected to a predetermined selection of the external interconnects 304, such as leads, with inner interconnects 312, such as bond wires or ribbon bonds. Preferably, the die-attach paddle 310 is formed coplanar to an interior portion of the external interconnects 304, providing an integration and interconnection structure with another integrated circuit device.

The die-attach paddle 310 also includes a second mounting surface 314 on an opposing side of the first mounting surface 308, the second mounting surface 314 mounted to the external interconnects 304. A package encapsulation 302, such as an epoxy molding compound, encapsulates the integrated circuit die 306 and the inner interconnects 312. The package encapsulation 302 includes a recess 316 partially exposing an interior portion of the external interconnects 304.

The adhesive 318, such as a die-attach adhesive, attaches an integrated circuit device 320, such as another integrated circuit die, to the die-attach paddle 310 exposed in the recess 316. A device active side 322 of the integrated circuit device 320 faces away from the second mounting surface 314. Device interconnects 324, such as bond wires or ribbon bonds, connect the device active side 322 to a predetermined selection of the external interconnects 304 at a tip 326 of the external interconnects 304 and at an opposing side of the external interconnects 304 with the integrated circuit die 306.

Preferably, an inner encapsulation 328 is formed over the integrated circuit device 320. The inner encapsulation 328 is optional and may be made of the same material as the package encapsulation 302 or a different material. The inner encapsulation 328 encapsulates the integrated circuit device 320 and the device interconnects 324 in the recess 316. The inner encapsulation 328 also fills the recess 316 covering the interior portion of the external interconnects 304 exposed by the package encapsulation 302 in the recess 316.

Figure 4:
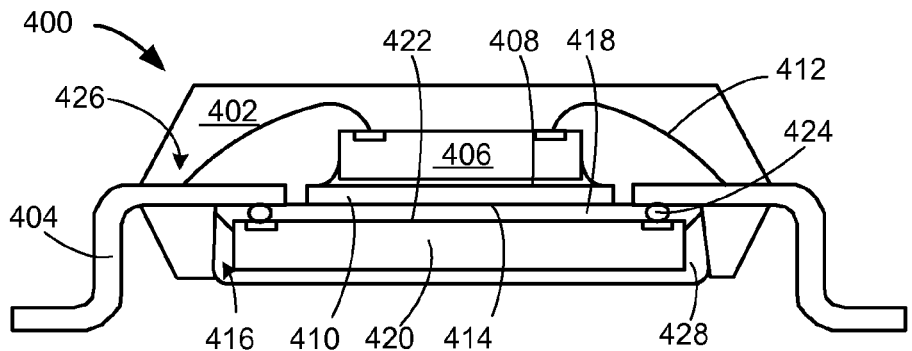
FIG. 4 is a cross-sectional view similar to FIG. 2 of an integrated circuit package system in a third embodiment of the present invention.

Referring now to FIG. 4, therein is shown a cross-sectional view similar to FIG. 2 of an integrated circuit package system 400 in a third embodiment of the present invention. The integrated circuit package system 400 includes structural similarities to the integrated circuit package system 300 of FIG. 3.

An integrated circuit die 406 is mounted with an adhesive to a first mounting surface 408 of a mounting structure that is the die-attach paddle 410. The integrated circuit die 406 is electrically connected to a predetermined selection of external interconnects 404, such as leads, with inner interconnects 412 such as bond wires or ribbon bonds. The die-attach paddle 410 also includes a second mounting surface 414 on an opposing side of the first mounting surface 408. Preferably, the die-attach paddle 410 is formed coplanar to the external interconnects 404.

A package encapsulation 402, such as an epoxy molding compound, encapsulates the integrated circuit die 406 and the inner interconnects 412. The package encapsulation 402 includes a recess 416 exposing the second mounting surface 414 and the interior portion of the external interconnects 404. An integrated circuit device 420, such as a flip chip, is mounted with a device active side 422 to the second mounting surface 414, with an adhesive 418, such as an under-fill material. The integrated circuit device 420 is electrically connected on the device active side 422 with device interconnects 424, such as solder bumps. The device interconnects 424 connect the device active side 422 to a predetermined selection of the external interconnects 404 at a tip 426 of the external interconnects 404, at an opposing side of the external interconnects 404 with the integrated circuit die 406.

An inner encapsulation 428 is optional and may be made of the same material as the package encapsulation 402 or a different material. The inner encapsulation 428 encapsulates the integrated circuit device 420 and the inner interconnects 412 in the recess 416. The inner encapsulation 428 also fills the recess 416 covering the interior portion of the external interconnects 404 and the second mounting surface 414 exposed by the package encapsulation 402 in the recess 416.

Thicknesses of the package encapsulation 402 and the inner encapsulation 428 do not impede the external interconnects 404 for connections to the next system level, such as a printed circuit board or another integrated circuit package system, thereby increasing the integrated circuit content. Increased package density maximizes integration of integrated circuits and functionalities within an integrated circuit package.

Figure 5:
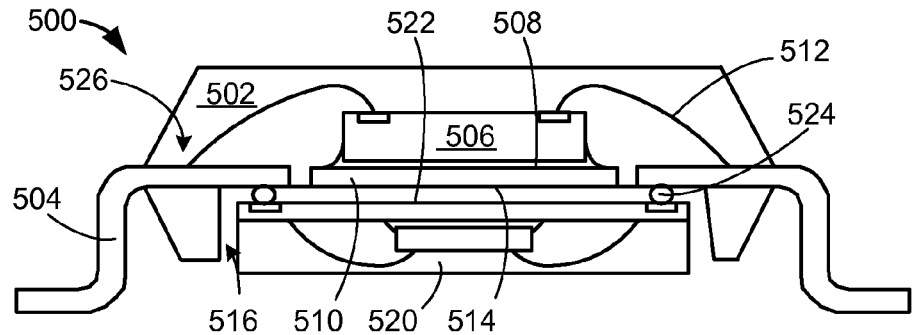
FIG. 5 is a cross-sectional view similar to FIG. 2 of an integrated circuit package system in a fourth embodiment of the present invention.

Referring now to FIG. 5, therein is shown a cross-sectional view similar to FIG. 2 of an integrated circuit package system 500 in a fourth embodiment of the present invention. The integrated circuit package system 500 includes structural similarities to the integrated circuit package system 400 of FIG. 4.

An integrated circuit die 506 is mounted with an adhesive to a first mounting surface 508 of a mounting structure that is the die-attach paddle 510. The integrated circuit die 506 is electrically connected to a predetermined selection of external interconnects 504, such as leads, with inner interconnects 512 such as bond wires or ribbon bonds. The die-attach paddle 510 also includes a second mounting surface 514 on an opposing side of the first mounting surface 508. Preferably, the die-attach paddle 510 is formed coplanar to the external interconnects 504.

A package encapsulation 502, such as an epoxy molding compound, encapsulates the integrated circuit die 506 and the inner interconnects 512. The package encapsulation 502 includes a recess 516 exposing the second mounting surface 514 and the interior portion of the external interconnects 504. A packaged integrated circuit 520 is mounted with a device active side 522 facing the second mounting surface 514. The packaged integrated circuit 520 is electrically connected on the device active side 522 with device interconnects 524, such as solder bumps. The device interconnects 524 connect the device active side 522 to a predetermined selection of the external interconnects 504 at a tip 526 of the external interconnects 504 and at an opposing side of the external interconnects 504 with the integrated circuit die 506.

Figure 6:
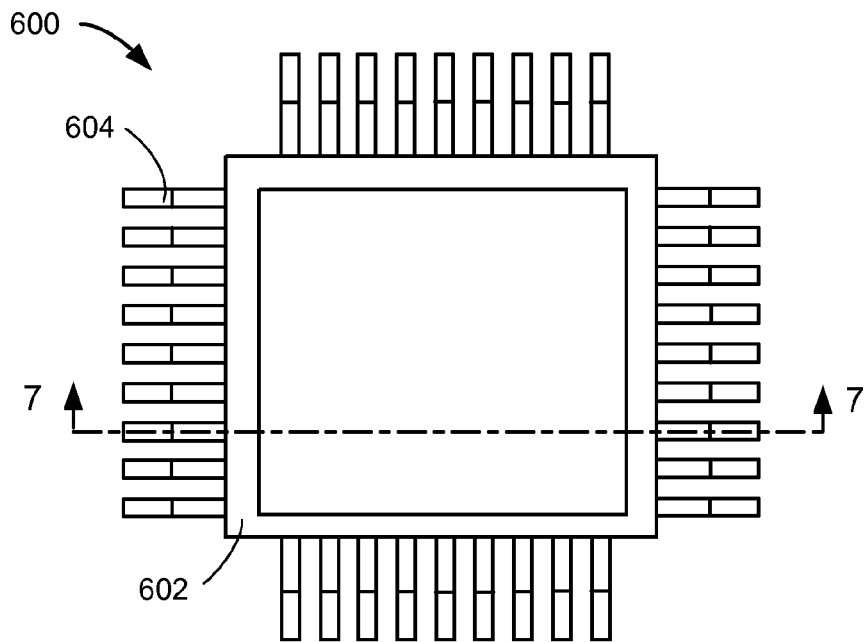
FIG. 6 is a bottom view of an integrated circuit package system in a fifth embodiment of the present invention.

Referring now to FIG. 6, therein is shown a bottom view of an integrated circuit package system 600 in a fifth embodiment of the present invention. The bottom view depicts a package encapsulation 602, such as an epoxy molded compound, with external interconnects 604 extending therefrom. The external interconnects 604 may be a number of types of leads. For example, the external interconnects 604 may be leads for a quad flat package.

Figure 7:
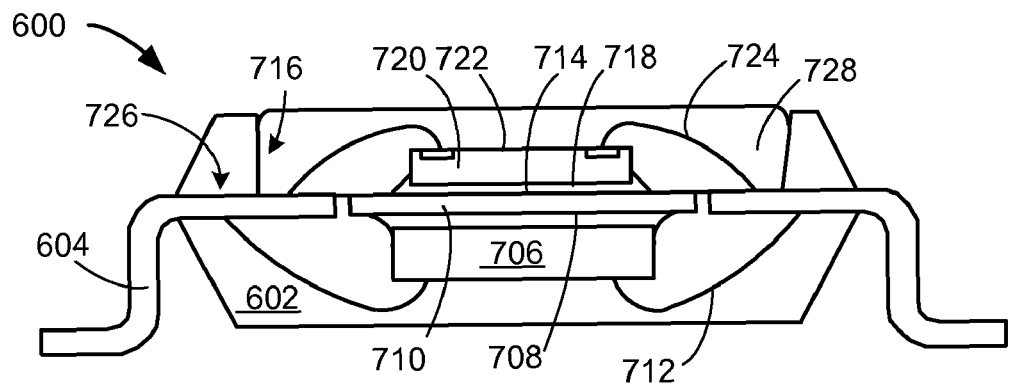
FIG. 7 is a cross-sectional view of an integrated circuit package system exemplified by the bottom view of FIG. 6 along a line 7-7.

Referring now to FIG. 7, therein is shown a cross-sectional view of the integrated circuit package system 600 having the bottom view of FIG. 6 along a line 7-7. The integrated circuit package system 600 is similar to the integrated circuit package system 300 of FIG. 3.

An integrated circuit die 706 is mounted with an adhesive under a first mounting surface 708 of a mounting structure that is the die-attach paddle 710. The integrated circuit die 706 is electrically connected to a predetermined selection of the external interconnects 604 with inner interconnects 712 such as bond wires or ribbon bonds. The die-attach paddle 710 also includes a second mounting surface 714 on an opposing side of the first mounting surface 708. Preferably, the die-attach paddle 710 is formed coplanar to the external interconnects 604.

The package encapsulation 602, such as an epoxy molding compound, encapsulates the integrated circuit die 706 and the inner interconnects 712. The package encapsulation 602 includes a recess 716 exposing the second mounting surface 714 and the interior portion of the external interconnects 604. An adhesive 718, such as a die-attach adhesive, attaches an integrated circuit device 720, such as another integrated circuit die, to the die-attach paddle 710 exposed in the recess 716. A device active side 722 of the integrated circuit device 720 faces away from the second mounting surface 714. The integrated circuit device 720 is electrically connected on the device active side 722 with device interconnects 724, such as bond wires or ribbon bonds. The device interconnects 724 electrically connects the device active side 722 to a predetermined selection of the external interconnects 604 at a tip 726 of the external interconnects 604, at an opposing side of the external interconnect with the integrated circuit die 706.

An inner encapsulation 728 is optional and may be made of the same material as the package encapsulation 602 or a different material. The inner encapsulation 728 encapsulates the integrated circuit device 720 and the device interconnects 724 in the recess 716. The inner encapsulation 728 also fills the recess 716 covering the interior portion of the external interconnects 604 and the second mounting surface 714 exposed by the package encapsulation 602 in the recess 716. For example, the inner encapsulation 728 may be optically translucent or clear such that the integrated circuit device 720 may provide optical sensing or optical emission functions.

Thicknesses of the package encapsulation 602 do not impede the external interconnects 604 for connections to the next system level, such as a printed circuit board or another integrated circuit package system, thereby increasing the integrated circuit content. Increased package density maximizes integration of integrated circuits and functionalities within an integrated circuit package.

Figure 8:
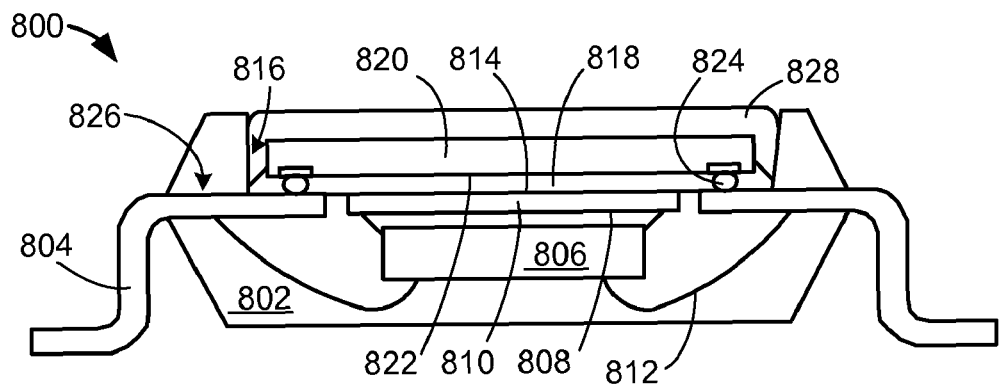
FIG. 8 is a cross-sectional view similar to FIG. 7 of an integrated circuit package system in a sixth embodiment of the present invention.

Referring now to FIG. 8, therein is shown a cross-sectional view similar to FIG. 7 of an integrated circuit package system 800 in a sixth embodiment of the present invention. The integrated circuit package system 800 is similar to the integrated circuit package system 600 of FIG. 7.

An integrated circuit die 806 is mounted with an adhesive under a first mounting surface 808 of a mounting structure that is the die-attach paddle 810. The integrated circuit die 806 is electrically connected to a predetermined selection of external interconnects 804, such as leads, with inner interconnects 812 such as bond wires or ribbon bonds. The die-attach paddle 810 also includes a second mounting surface 814 on an opposing side of the first mounting surface 808. Preferably, the die-attach paddle 810 is formed coplanar to the external interconnects 804.

A package encapsulation 802, such as an epoxy molding compound, encapsulates the integrated circuit die 806 and the inner interconnects 812. The package encapsulation 802 includes a recess 816 exposing the second mounting surface 814 and the interior portion of the external interconnects 804. An integrated circuit device 820, such as a flip chip, is mounted to the second mounting surface 814 with an adhesive 818, such as an under-fill material. A device active side 822 of the integrated circuit device 820 faces the second mounting surface 814. The integrated circuit device 820 is electrically connected on the device active side 822 with device interconnects 824, such as solder bumps. The device interconnects 824 electrically connects the device active side 822 to a predetermined selection of the external interconnects 804 at a tip 826 of the external interconnects 804 and at an opposing side of the external interconnects 804 with the integrated circuit die 806.

An inner encapsulation 828 is optional and may be made of the same material as the package encapsulation 802 or a different material. The inner encapsulation 828 encapsulates the integrated circuit device 820 and the device interconnects 824 in the recess 816. The inner encapsulation 828 also fills the recess 816 covering the interior portion of the external interconnects 804 and the second mounting surface 814 exposed by the package encapsulation 802 in the recess 816. For example, the inner encapsulation 828 may be optically translucent or clear such that the integrated circuit device 820 may provide optical sensing or optical emission functions.

Figure 9:
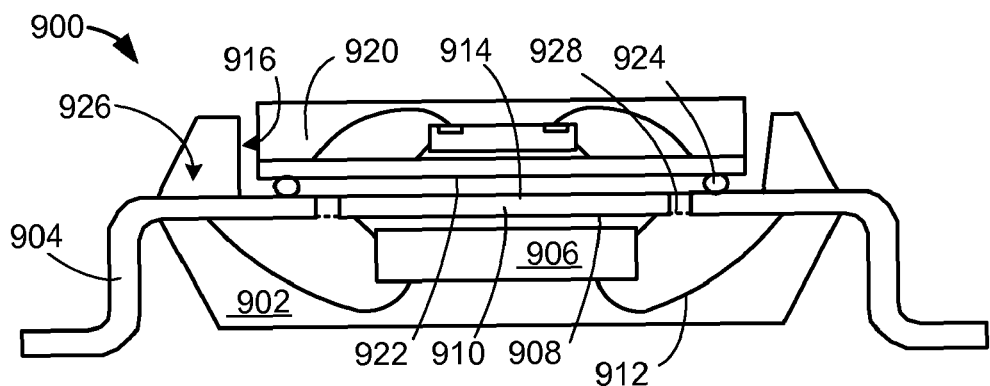
FIG. 9 is a cross-sectional view similar to FIG. 7 of an integrated circuit package system in a seventh embodiment of the present invention.

Referring now to FIG. 9, therein is shown a cross-sectional view similar to FIG. 7 of an integrated circuit package system 900 in a seventh embodiment of the present invention. The integrated circuit package system 900 is similar to the integrated circuit package system 800 of FIG. 8.

An integrated circuit die 906 is mounted with an adhesive under a first mounting surface 908 of a mounting structure that is the die-attach paddle 910. The integrated circuit die 906 is electrically connected to a predetermined selection of external interconnects 904, such as leads, with inner interconnects 912 such as bond wires or ribbon bonds. The die-attach paddle 910 also includes a second mounting surface 914 on an opposing side of the first mounting surface 908. Preferably, the die-attach paddle 910 is formed coplanar to the external interconnects 904.

A package encapsulation 902, such as an epoxy molding compound, encapsulates the integrated circuit die 906 and the inner interconnects 912. The package encapsulation 902 includes a recess 916 exposing the second mounting surface 914 and the interior portion of the external interconnects 904. The package encapsulation 902 may include channels 928 between the external interconnects 904 and the die-attach paddle 910. The channels 928 are optional and depicted by dotted lines.

The packaged integrated circuit 920 is mounted to the second mounting surface 914 and electrically connected with device interconnects 924, such as solder bumps. The device interconnects 924 electrically connect a device active side 922 to a predetermined selection of the external interconnects 904 at a tip 926 of the external interconnects 904 and at an opposing side of the external interconnects 904 with the integrated circuit die 906. The channels may function for controlling spread or flow of the device interconnects 924. For example, the packaged integrated circuit 920 may be optically translucent or clear providing optical sensing or optical emission functions.

Figure 10:
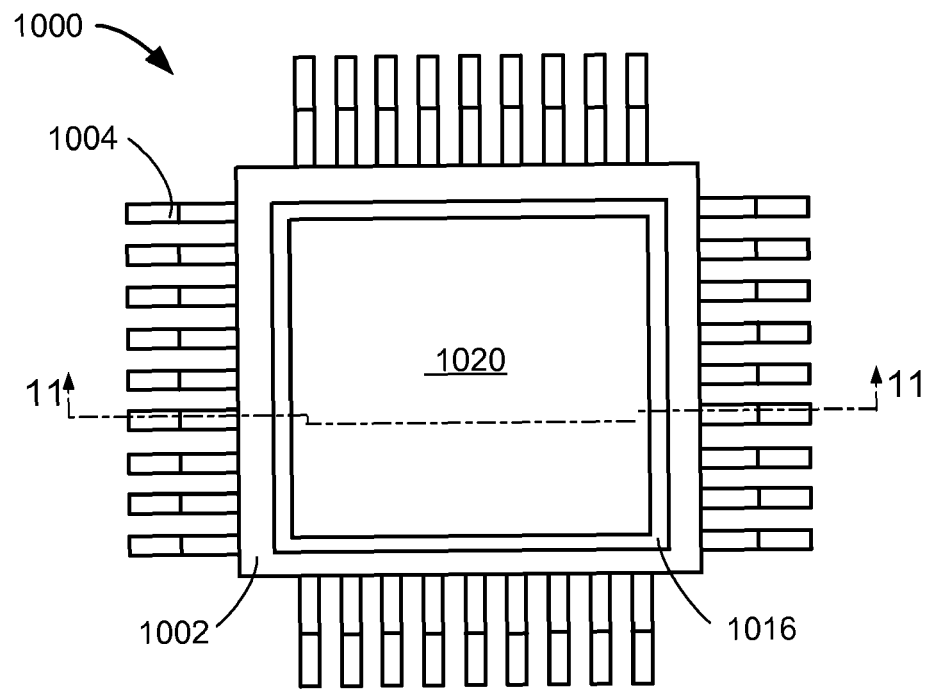
FIG. 10 is a top view of an integrated circuit package system in an eighth embodiment of the present invention.

Referring now to FIG. 10, therein is shown a top view of an integrated circuit package system 1000 in an eighth embodiment of the present invention. The top view depicts a package encapsulation 1002, such as an epoxy molded compound, with external interconnects 1004 extending therefrom. The external interconnects 1004 may be a number of types of leads. For example, the external interconnects 1004 may be leads for a quad flat package. An integrated circuit device 1020, such as a flip chip, mounted into a recess 1016 of the package encapsulation 1002.

Figure 11:
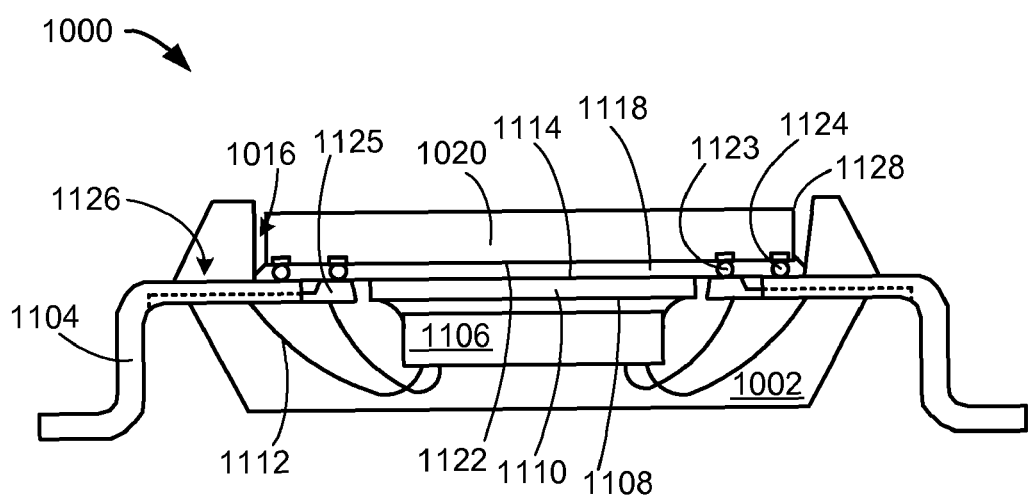
FIG. 11 is a cross-sectional view of the integrated circuit package system along a line 11-11 of FIG. 10.

Referring now to FIG. 11, therein is shown a cross-sectional view of the integrated circuit package system 1000 having the bottom view along a line 11-11 of FIG. 10. The integrated circuit package system 1000 includes structural similarities to the integrated circuit package system 800 of FIG. 8.

An integrated circuit die 1106 is mounted with an adhesive under a first mounting surface 1108 of a mounting structure that is a die-attach paddle 1110. The integrated circuit die 1106 is electrically connected to a predetermined selection of outer tips 1126 of the external interconnects 1004, such as leads, with inner interconnects 1112, such as bond wires or ribbon bonds. The outer tips 1126 are exposed in the recess 1016.

The inner interconnects 1112 also connect the integrated circuit die 1106 and inner tips 1125. The inner tips 1125 are also exposed in the recess 1016 and extend more towards to the die-attach paddle 1110 than the outer tips 1126. The die-attach paddle 1110 also includes a second mounting surface 1114 on an opposing side of the first mounting surface 1108. Preferably, the die-attach paddle 1110 is formed coplanar to the outer tips 1126 and the inner tips 1125.

The package encapsulation 1002 encapsulates the integrated circuit die 1106 and the inner interconnects 1112. The package encapsulation 1002 includes the recess 1016 exposing the second mounting surface 1114 and the outer tips 1126. The integrated circuit device 1020 is mounted to the second mounting surface 1114 with an adhesive 1118, such as an under-fill material. Device interconnects 1124, sold as solder bumps, connect an device active side 1122 of the integrated circuit device 1020 to both the outer tips 1126 and the inner tips 1125 exposed in the recess 1016.

The inner tips 1125 may serve a number of functions. For example, the inner tips 1125 provide electrical connections between the integrated circuit die 1106 in the package encapsulation 1002 and the integrated circuit device 1020 at the exterior of the package encapsulation 1002. The inner tips 1125 may be formed from substantially the same material as the external interconnects 1004 and the die-attach paddle 1110 and from the same lead frame (not shown) without requiring a separate redistribution structure which would add cost, complexity, and reduce yield.

Figure 12:
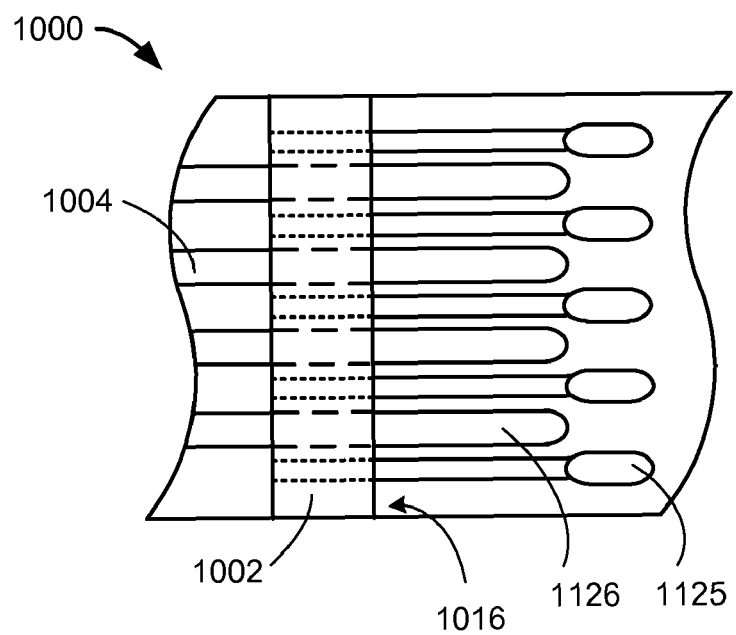
FIG. 12 is a plan view of a portion of the integrated circuit package system of FIG. 10.

Referring now to FIG. 12, therein is shown a plan view of a portion of the integrated circuit package system 1000 of FIG. 10. The plan view is the top view of FIG. 10 without the integrated circuit device 1020 of FIG. 11 shown. The top view depicts the outer tips 1126 and the inner tips 1125 exposed in the recess 1016 of the package encapsulation 1002.

The inner tips 1125 are depicted as dotted lines under the package encapsulation 1002 adjacent to the recess 1016. The inner tips 1125 do not extend beyond the peripheral boundary of the package encapsulation 1002.

The outer tips 1126 are the exposed portion of the external interconnects 1004 shown in the recess 1016. The external interconnects 1004 are depicted as dashed lines under the package encapsulation 1002 ad adjacent to the recess 1016. As shown in FIG. 11, the external interconnects 1004 extend beyond the peripheral boundary of the package encapsulation 1002 for connections to the next system level (not shown), such as a printed circuit board or another integrated circuit package system.

Figure 13:
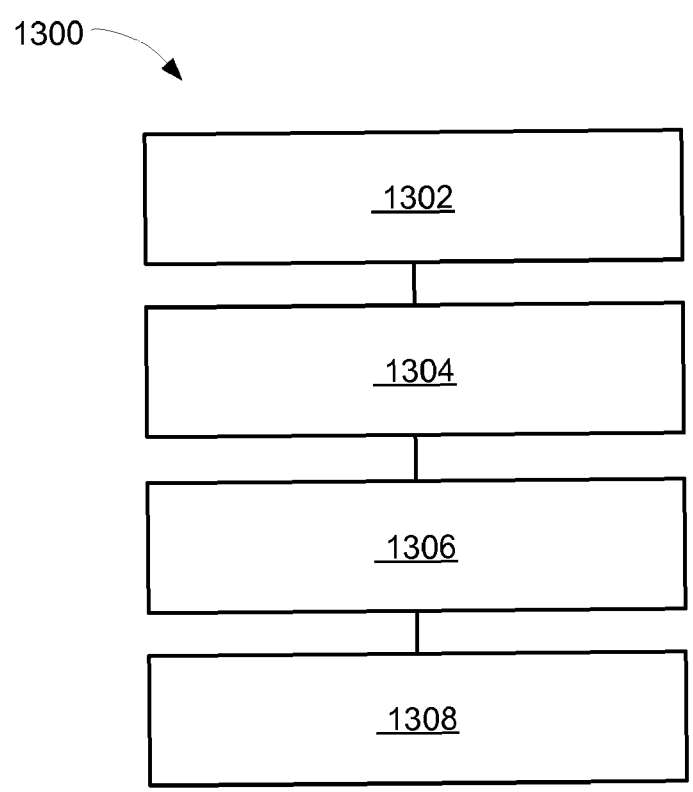
FIG. 13 is a flow chart of an integrated package system for manufacturing the integrated circuit package system in an embodiment of the present invention.

Referring now to FIG. 13, therein is shown a flow chart of an integrated circuit package system 1300 for manufacturing the integrated circuit package system 100 in an embodiment of the present invention. The system 1300 includes forming an external interconnect in a block 1302; connecting an integrated circuit die and the external interconnect in a block 1304; forming a package encapsulation, having a recess, covering the integrated circuit die with a portion of the external interconnect exposed by the recess in a block 1306; and connecting an integrated circuit device and the external interconnect in the recess in a block 1308.

An aspect of the present invention is to provide ease of integration and interconnection with another device, which can be done while the QFP is still in strip form and not singulated. The molded QFP strip can act as the substrate on which the device to be integrated may be attached and processed in array sequence. After singulation, the invention provide another ease of integration and interconnection to other devices by allowing layout of the singulated devices in an array on a boat or tape stiffener for ease of attachment of the devices to other devices. Moreover, board level integration and integration is also facilitated for package on package integration.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for improving yield, increasing reliability, and reducing cost of integrated circuit package system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing an integrated circuit package system comprising:
   forming an external interconnect;
   connecting an integrated circuit die and the external interconnect;
   forming a package encapsulation covering the integrated circuit die with an inner portion of the external interconnect in a recess of the package encapsulation including not covering the interior portion of the external interconnect by the package encapsulation; and
   connecting an integrated circuit device and the external interconnect, on the interior portion, in the recess including not covering or contacting the integrated circuit device by the package encapsulation, the external interconnect attached between the integrated circuit device and the integrated circuit die.

2. The method as claimed in claim 1 wherein:
   forming the external interconnect includes:
      forming a die-attach paddle; and
   further comprising:
      mounting the integrated circuit die to the die-attach paddle.

3. The method as claimed in claim 1 further comprising:
   forming a mounting structure over the external interconnect with the mounting structure having a material not included in the external interconnect; and
   mounting the integrated circuit die over the mounting structure.

4. The method as claimed in claim 1 further comprising:
   forming an adhesive layer over the external interconnect; and
   mounting the integrated circuit die over the adhesive layer.

5. The method as claimed in claim 1 further comprising:
   forming an inner tip exposed in the recess;
   connecting the integrated circuit die and the inner tip; and wherein connecting the integrated circuit device and the external interconnect in the recess includes:
connecting the integrated circuit device and the inner tip in the recess.

6. A method of manufacturing an integrated circuit package system comprising:
forming an external interconnect;
connecting an integrated circuit die to the external interconnect;
forming a package encapsulation for covering the integrated circuit die with the external interconnect partially exposed by a recess of the package encapsulation including not covering an interior portion on the external interconnect, at an opposing side with the integrated circuit die, by the package encapsulation; and
connecting an integrated circuit device and the external interconnect, on the interior portion, in the recess including not covering or contacting the integrated circuit device by the package encapsulation, the external interconnect attached between the integrated circuit device and the integrated circuit die.

7. The method as claimed in claim 6 wherein connecting the integrated circuit device and the external interconnect in the recess includes mounting the integrated circuit device over the integrated circuit die.

8. The method as claimed in claim 6 further comprising forming an inner encapsulation for covering the integrated circuit device in the recess.

9. The method as claimed in claim 6 wherein forming the package encapsulation includes forming a channel in the package encapsulation adjacent to the external interconnect in the recess.

10. The method as claimed in claim 6 wherein connecting the integrated circuit device includes mounting a packaged integrated circuit.

11. An integrated circuit package system comprising:
an external interconnect;
an integrated circuit die connected with the external interconnect;
a package encapsulation for covering the integrated circuit die with an interior portion of the external interconnect in a recess of the package encapsulation in which the interior portion of the external interconnect is not covered by the package encapsulation; and
an integrated circuit device mounted on the interior portion and connected with the external interconnect in the recess includes the integrated circuit device is not covered by and does not contact the package encapsulation, the external interconnect attached between the integrated circuit device and the integrated circuit die.

12. The system as claimed in claim 11 further comprising a die-attach paddle with the integrated circuit die mounted to the die-attach paddle.

13. The system as claimed in claim 11 further comprising a mounting structure over the external interconnect with the mounting structure having a material not included in the external interconnect and the integrated circuit die over the mounting structure.

14. The system as claimed in claim 11 further comprising an adhesive layer over the external interconnect with the integrated circuit die over the adhesive layer.

15. The system as claimed in claim 11 further comprising:
an inner tip exposed in the recess with the integrated circuit die connected with the inner tip; and
wherein the integrated circuit device connected with the external interconnect in the recess includes:
the integrated circuit device connected with the inner tip in the recess.

16. The system as claimed in claim 11 wherein the package encapsulation includes the recess with the mounting surface, on the external interconnect at an opposing side from the integrated circuit die, not covered by the package encapsulation.

17. The system as claimed in claim 16 wherein the integrated circuit device is over the integrated circuit die.

18. The system as claimed in claim 16 further comprising an inner encapsulation for covering the integrated circuit device in the recess.

19. The system as claimed in claim 16 wherein the package encapsulation includes a channel adjacent to the external interconnect in the recess.

20. The system as claimed in claim 16 wherein the integrated circuit device is a packaged integrated circuit.

* * * * *